United States Patent
Hsu et al.

(10) Patent No.: US 7,208,372 B2
(45) Date of Patent: Apr. 24, 2007

(54) NON-VOLATILE MEMORY RESISTOR CELL WITH NANOTIP ELECTRODE

(75) Inventors: Sheng Teng Hsu, Camas, WA (US); Fengyan Zhang, Vancouver, WA (US); Gregory M. Stecker, Vancouver, WA (US); Robert A. Barrowcliff, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 82 days.

(21) Appl. No.: 11/039,544

(22) Filed: Jan. 19, 2005

(65) Prior Publication Data

US 2006/0160304 A1 Jul. 20, 2006

(51) Int. Cl.
*H01L 21/06* (2006.01)
*H01L 21/461* (2006.01)

(52) U.S. Cl. .............. 438/257; 438/618; 438/734; 257/E45.002

(58) Field of Classification Search ............... 438/257, 438/618, 734; 257/E43.002
See application file for complete search history.

(56) References Cited

U.S. PATENT DOCUMENTS

| | | | |
|---|---|---|---|
| 6,040,230 A * | 3/2000 | Anthony et al. | 438/398 |
| 6,232,174 B1 * | 5/2001 | Nagata et al. | 438/253 |
| 6,323,044 B1 * | 11/2001 | Harris et al. | 438/3 |
| 6,455,329 B1 * | 9/2002 | Kim et al. | 438/3 |
| 6,870,751 B2 * | 3/2005 | Van Brocklin et al. | 365/96 |
| 6,872,618 B2 * | 3/2005 | Lee et al. | 438/240 |
| 7,001,821 B2 * | 2/2006 | Aggarwal et al. | 438/396 |
| 7,049,650 B1 * | 5/2006 | Itokawa et al. | 257/310 |
| 2001/0013614 A1 * | 8/2001 | Joshi et al. | 257/295 |
| 2004/0160804 A1 * | 8/2004 | Rinerson et al. | 365/158 |
| 2005/0180189 A1 * | 8/2005 | Happ et al. | 365/145 |
| 2006/0073613 A1 * | 4/2006 | Aggarwal et al. | 438/3 |
| 2006/0118841 A1 * | 6/2006 | Eliason et al. | 257/295 |

OTHER PUBLICATIONS (Reui-san Chen, Growth of IrO2 Films and Nanorods by means of CVD: An Example of Composition and Morphological Control of Nanostructures Nov. 11, 2002, Chemical Vapour Deposition 2003, 9, No. 6, pp. 301-305).*

(Continued)

*Primary Examiner*—Andy Huynh
*Assistant Examiner*—David Goodwin
(74) *Attorney, Agent, or Firm*—Law Office of Gerald Maliszewski; Gerald Maliszewski

(57) ABSTRACT

A non-volatile memory resistor cell with a nanotip electrode, and corresponding fabrication method are provided. The method comprises: forming a first electrode with nanotips; forming a memory resistor material adjacent the nanotips; and, forming a second electrode adjacent the memory resistor material, where the memory resistor material is interposed between the first and second electrodes. Typically, the nanotips are iridium oxide (IrOx) and have a tip base size of about 50 nanometers, or less, a tip height in the range of 5 to 50 nm, and a nanotip density of greater than 100 nanotips per square micrometer. In one aspect, the substrate material can be silicon, silicon oxide, silicon nitride, or a noble metal. A metalorganic chemical vapor deposition (MOCVD) process is used to deposit Ir. The IrOx nanotips are grown from the deposited Ir.

13 Claims, 5 Drawing Sheets

OTHER PUBLICATIONS

Reui-san Chen, Growth and Charecterization of Vertically Aligned IrO2 Nanorods,Aug. 13, 2003, Journal of Materials Chemistry 13 pp. 2525-2529.*

Reui San Chen, Morphological evolution of the self-assembled IrO2 one-dimensional nanocrystals, Feb. 12, 2004 Nanotechnology 16 pp. 93-97.*

R. Chen et al, APL vol. 84, #9, 2004, p. 1552-1554.

S. Q. Liu, N. J. Wu, and A. Ignatiev, Electrical-pulse-induced reversible resistance change effect in magnetoresistive films APL. vol. 76, #19, p. 2749.

* cited by examiner

NON-VOLATILE MEMORY RESISTOR CELL WITH NANOTIP ELECTRODE

BACKGROUND OF THE INVENTION

1. Field of the Invention

This invention generally relates to integrated circuit (IC) fabrication and, more particularly, to a memory resistor cell made using an electrode with nanotips.

2. Description of the Related Art

Semiconductor IC memory devices have replaced magnetic-core memory devices, as IC devices have lower fabrications cost and exhibit higher performance. An IC memory circuit includes a repeated array of memory cells, each of which stores one state of a two-state information (0 or 1), or multi-state information (for example, 00, 01, 10, or 11 of 4 states). This array of cells works together with support circuitry such as a row decoder, a column decoder, a write circuit to write to the memory cell array, a control circuitry to select the correct memory cell, and a sense amplifier to amplify the signal.

One conventional memory circuit, the flip-flop, has an output that is stable for only one of two possible voltage levels. SRAM (static random access memory) circuits store information in flip-flops where the information can be read from any memory cell at random (random access memory), and where the stored information can be kept indefinitely as long as the circuit receives power.

The more recently developed memory cell is a DRAM (dynamic random access memory) cell. A DRAM cell typically includes a transistor and a capacitor. The capacitor stores information in the form of electrical charge and the transistor provides access to the capacitor. Because of the inherent leakage of the capacitor charge, DRAM cells must be rewritten or refreshed at frequent intervals.

SRAM and DRAM memories cannot retain the stored information without a power source. Therefore, they belong to a class of memory called volatile memory. Another class of memory is called non-volatile memory, which retains the stored information even after the power is turned off.

A typical non-volatile memory is ferroelectric random access memory (FRAM). Similar to a DRAM cell, a FRAM cell includes an access transistor and a storage capacitor. The difference is that FRAM cell uses ferroelectric material for its capacitor dielectric, and the information is stored as the polarization state of the ferroelectric material. Ferroelectric material can be polarized by an electric field with a polarization lifetime of longer than 10 years.

Recent developments in materials, with changeable electrical resistance, have introduced a new kind of non-volatile memory, called RRAM (resistive random access memory). The basic component of a RRAM cell is a variable resistor. The variable resistor can be programmed to have high resistance or low resistance (in two-state memory circuits), or any intermediate resistance value (in multi-state memory circuits). The different resistance values of the RRAM cell represent the information stored in the RRAM circuit. The advantages of RRAM are the simplicity of the circuit, resulting in smaller devices, non-volatile memory characteristics, and an inherently stable memory state.

Since a resistor is a passive component, and cannot actively influence nearby electrical components, a basic RRAM cell can formed with just a variable resistor, arranged in a cross point resistor network to form a cross point memory array. To prevent cross talk or a parasitic current path, a RRAM cell can further include a diode. This resistor/diode combination is sometimes called a 1R1D (or 1D1R) cross point memory cell. To provide better access, a RRAM can include an access transistor, as in a DRAM or FRAM cell, and this combination is sometimes called a 1R1T (or 1T1R) cross point memory cell.

The resistance states of the RRAM can be represented by different techniques such as structural, polarization, or magnetization state. A Chalcogenide alloy is an example of structural state RRAM device. Chalcogenide alloys can exhibit two different stable reversible structural phases, namely an amorphous phase with high electrical resistance, and a polycrystalline phase with lower electrical resistance. Resistive heating by an electrical current pulse can change the phases of the chalcogenide materials. One example of polarization state is a polymer memory element. The resistance state of a polymer memory element is dependent upon the orientation of polarization of the polymer molecules. The polarization of a polymer memory element can be written by applying an electric field.

Conventional memory resistor RRAM cells are made using planer metal top and bottom electrodes. The field intensity and the current density are typically very uniform across the electrode. Further, the physical structure of these devices is typically quite symmetrical. The symmetrical cell construction and uniform field intensities dictate that the memory states be changed using unipolar switching. That is, the resistor may be reversibly programmed to a high or a low resistance state by unipolar electrical pulses having different pulse widths. The power dissipation is, therefore, equal to IV. A relatively high current density is required for programming, which may be higher than the capacity of minimum-sized MOS transistors. For use in practical commercial applications, it would be desirable if the RRAM memory states could be switched using bipolar electrical pulses. One approach this problem has been to build physically asymmetric cells. Another approach has been to structure the memory resistor material, to create non-uniform field intensities in the memory resistor. However, these solutions may require extra fabrication processes.

It would be advantageous if a non-volatile resistor memory cell could be fabricated, that would be suitable for low-power, high-density, large-scale memory applications.

It would be advantageous if a non-volatile resistor memory cell could be practically fabricated using conventional CMOS processes, that could be programmed using bipolar pulses, as well as unipolar pulses.

SUMMARY OF THE INVENTION

The present application describes a memory resistor cell where one of the electrodes is formed with nanotips extending into the memory resistor material. The conductive nanotips create an asymmetric electrode structure that creates non-uniform fields. The non-uniform fields promote bipolar switching characteristics. The electric field at the nanotips is much higher than the average field. Therefore, lower voltage, low-power electrical pulses may be used for programming the resistor.

Accordingly, a method is provided for fabricating a nanotip electrode non-volatile memory resistor cell, the method comprises: forming a first electrode with nanotips; forming a memory resistor material adjacent the nanotips; and, forming a second electrode adjacent the memory resistor material, where the memory resistor material is interposed between the first and second electrodes. Typically, the nanotips are iridium oxide (IrOx) and have a tip base size of about 50 nanometers, or less, a tip height in the range of 5 to 50 nm, and a nanotip density of greater than 100 nanotips per square micrometer.

In one aspect, the substrate material can be silicon, silicon oxide, silicon nitride, or a noble metal. The specification below provides details of a metalorganic chemical vapor deposition (MOCVD) process that is used to deposit Ir. The IrOx nanotips are grown from the deposited Ir. In another aspect, a refractory metal film is formed overlying the substrate, and the IrOx nanotips are grown from Ir deposited on the refractory metal. The memory resistor material can be any conventional material, such as $Pr_{0.3}Ca_{0.7}MnO_3$ (PCMO), colossal magnetoresistive (CMR) film, transition metal oxides, Mott insulators, or high-temperature super conductor (HTSC) material.

In one aspect, the first electrode is the bottom electrode of the memory cell, and the memory resistor material is conformally deposited over the bottom electrode and bottom electrode nanotips. Then, the memory resistor material is planarized, and a top (second) electrode is formed overlying the memory resistor material. The top electrode can be made from a conventional material such as Pt, refractory metals, refractory metal oxides, refractory metal nitrides, or Al.

Additional details of the above-described method, and a nanotip electrode, non-volatile memory resistor cell are provided below.

DETAILED DESCRIPTION

Figure 1:
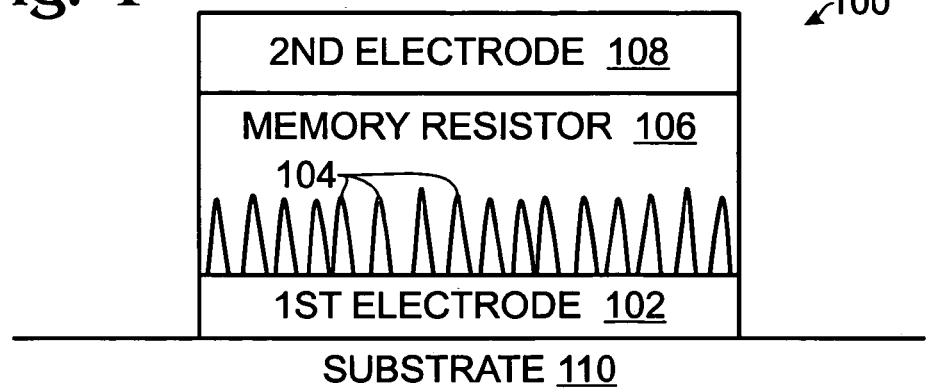
FIG. 1 is a partial cross-sectional view of a nanotip electrode non-volatile memory resistor cell.

FIG. 1 is a partial cross-sectional view of a nanotip electrode non-volatile memory resistor cell. The memory cell 100 comprises a first electrode 102 with nanotips 104. A memory resistor material 106 is adjacent the nanotips 104. A second electrode 108 is adjacent the memory resistor material 106. More specifically, the memory resistor material 106 is interposed between the first electrode 102 and second electrode 108. A number of different arrangements of memory resistor material are possible. Generally, the memory resistor material 106 may be on the nanotips 104, surrounding and on the nanotips, and between and on the nanotips. The arrangement shown in FIG. 1 satisfies all these descriptions, but other variations of the cell 100 are presented below.

As used herein, the word "nanotip" is not intended to be limited to any particular physical characteristics, shapes, or dimensions. The nanotips may alternately be known as nanorods, nanotubes, or nanowires. In some aspects (not shown), the nanotips may form a hollow structure. In other aspects (not shown), the nanotips may be formed with a plurality of tips ends.

Figure 2:
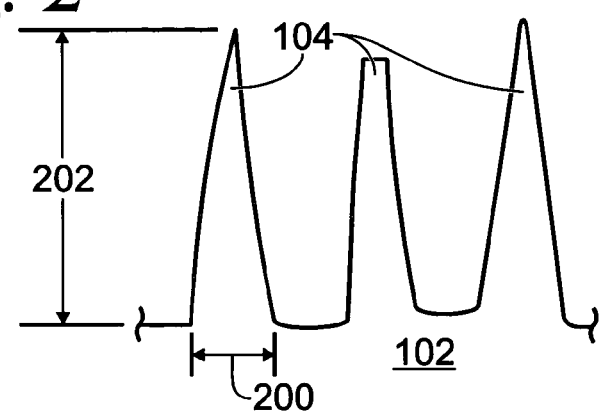
FIG. 2 is a partial cross-sectional view of the cell of FIG. 1, depicting some nanotips details.

FIG. 2 is a partial cross-sectional view of the cell of FIG. 1, depicting some nanotips details. The first electrode nanotips 104 have a tip base size 200 of about 50 nanometers, or less. The first electrode nanotips 104 have a tip height 202 in the range of 5 to 50 nm. Typically, the nanotip density is greater than 100 nanotips per square micrometer. That is, the number of nanotips growing from a 1-square micrometer surface area of the first electrode 102 exceeds typically exceeds 100. Typically, a higher nanotip density creates a larger differential between high and low resistance in the memory resistor material (assuming constant voltage pulses).

In one aspect, the first electrode nanotips 104 are made from iridium oxide (IrOx). The value of "x" may be 2, in which case the Ir is completely oxidized, to values approaching zero, in which case the Ir is incompletely oxidized. Although IrOx nanotips are used to illustrate to illustrate the invention, it is expected that nanotips can also be formed from the conductive oxides of other transition metals.

Returning to FIG. 1, some aspects the memory cell 100 further comprise a substrate 110 made from a material such as silicon, silicon oxide, silicon nitride, or a noble metal. The first electrode 102 is formed adjacent (overlying) the substrate 110.

Figure 3:
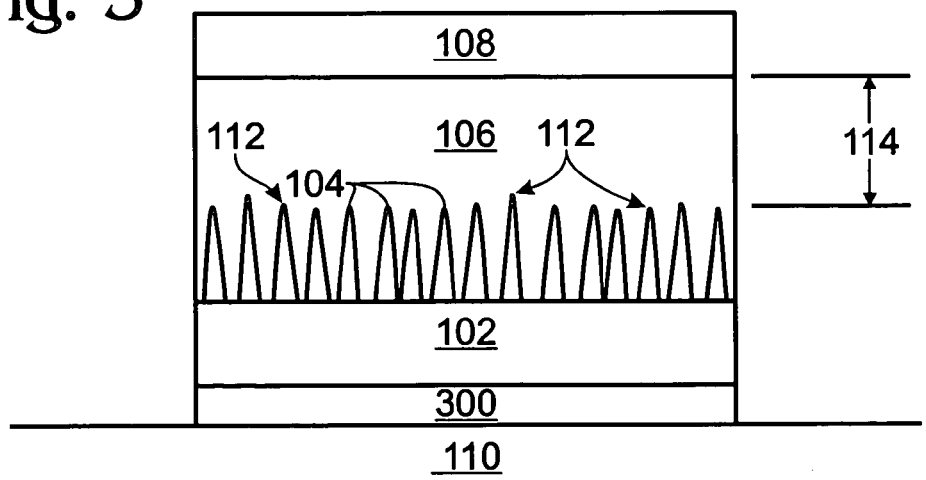
FIG. 3 is a partial cross-sectional view of a first variation of the memory cell of FIG. 1.

FIG. 3 is a partial cross-sectional view of a first variation of the memory cell of FIG. 1. In some aspects, the memory cell 100 comprises a substrate 110, with a refractory metal film 300 interposed between the substrate 110 and the first electrode 102.

Returning to FIG. 1, the memory resistor material 106 may be a material such as $Pr_{0.3}Ca_{0.7}MnO_3$ (PCMO), colossal magnetoresistive (CMR) film, transition metal oxides, Mott insulators, or high-temperature super conductor (HTSC) material. The cell 100 is not necessarily limited to this list of materials, as the invention can be enabled with other materials that exhibit memory resistance characteristics.

The first electrode nanotips 104 each have an end 112. As shown, the memory resistor material 106 has a thickness 114, between the first electrode nanotip ends 112 and the second electrode 108, in the range of 30 to 200 nm. The second electrode 108 may be a material such as Pt, refractory metals, refractory metal oxides, refractory metal nitrides, or Al. However, the cell could also be enabled with other materials.

Figure 4:
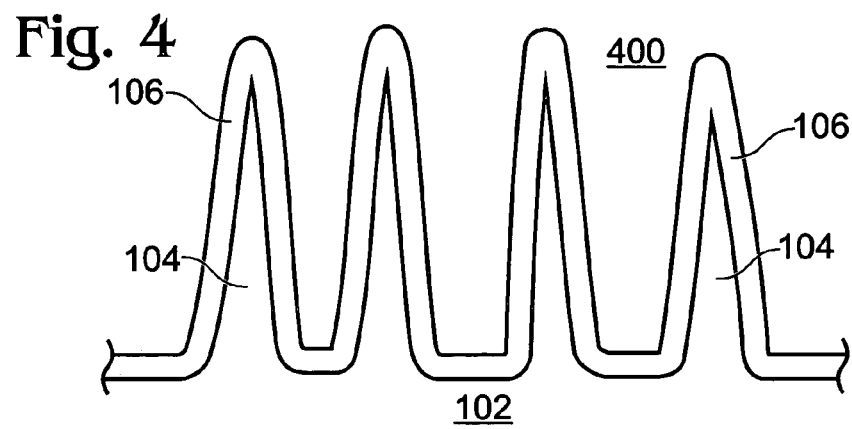
FIG. 4 is a partial cross-sectional view of a second variation of a nanotip electrode memory cell.
Figure 5:
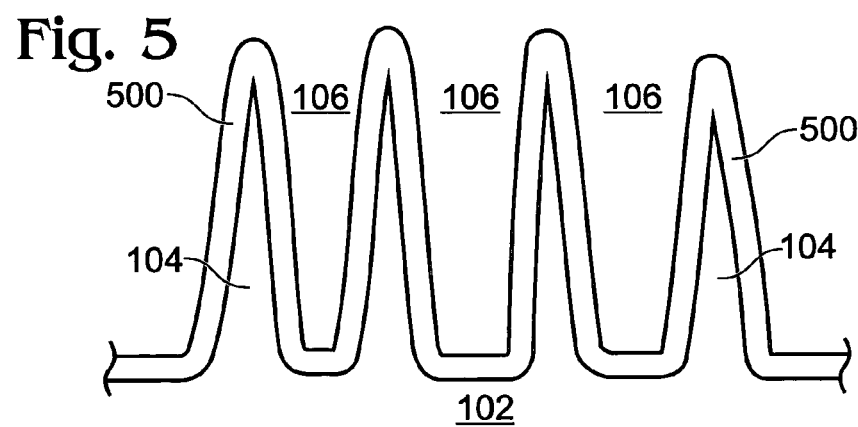
FIG. 5 is a partial cross-sectional view of a third variation of a nanotip electrode memory cell.

FIG. 4 is a partial cross-sectional view of a second variation of a nanotip electrode memory cell. In this variation, the memory cell material 106 is shown "on" the nanotips 104. Material 400 may be a memory resistor material, different than material 106, or a dielectric without memory resistance characteristics. FIG. 5 is a partial cross-sectional view of a third variation of a nanotip electrode memory cell. In this variation, the memory cell material 106 is shown between the nanotips 104. Material 500 may be a memory resistor material, different than material 106, or a dielectric without memory resistance characteristics. In one aspect, material 500 is crystallized Ir.

FUNCTIONAL DESCRIPTION

Figure 6:
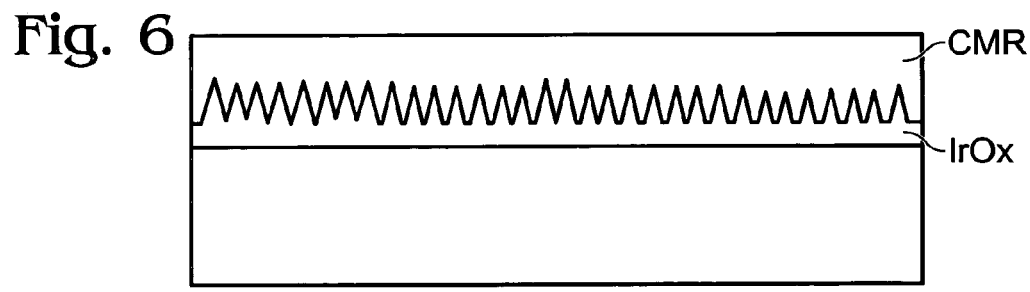
FIGS. 6 and 7 depict steps in the fabrication of the nanotip electrode non-volatile memory resistor RRAM cell.
Figure 7:
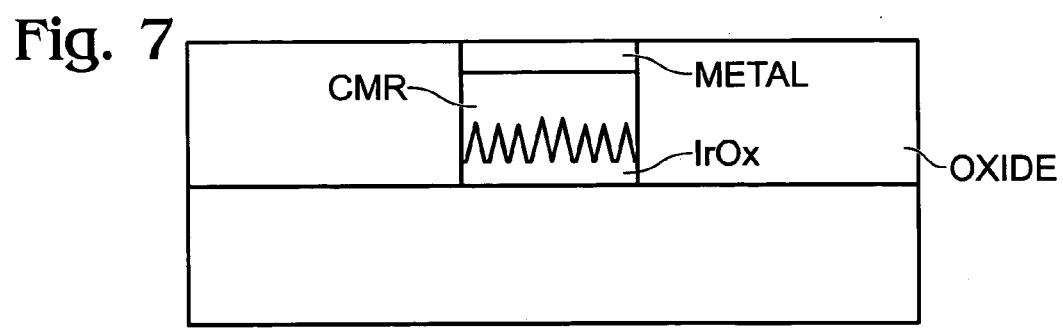

FIGS. 6 and 7 depict steps in the fabrication of the nanotip electrode non-volatile memory resistor RRAM cell. As shown, the bottom electrode is made of iridium oxide nanotips. The memory resistor, for the sake of simplicity, is denoted as CMR. The top electrode is a non-oxidiziable refractory metal or a refractory metal compound, such as Pt or TiN.

When a voltage is applied between the two electrodes, a very high field intensity is developed at the end of the IrOx nanotips. When a positive voltage pulse is applied to the top electrode, a high electron density is injected into the memory resistor from the IrOx nanotips. Hence, the CMR in the vicinity of the IrOx tips is turned to the high resistance phase. When a negative voltage pulse is applied to the top electrode, the high field intensity at the IrOx nanotips converts the CMR in the vicinity of the nanotips into low resistance phase CMR.

Figure 8:
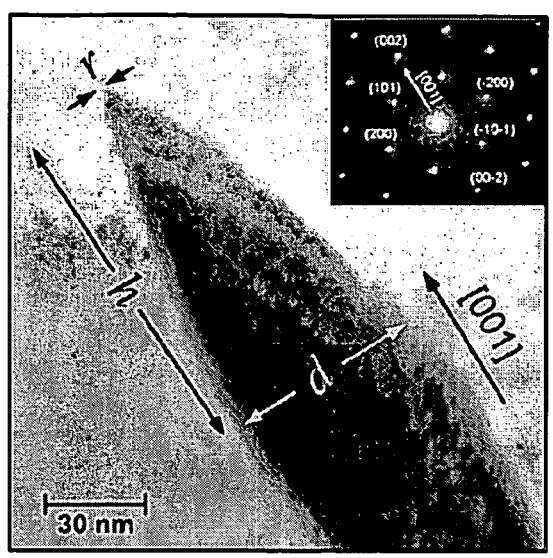
FIG. 8 is a scanning electron microscope (SEM) photo showing a detailed view of a nanotip end.

FIG. 8 is a scanning electron microscope (SEM) photo showing a detailed view of a nanotip end. Since the IrOx nanotips have a pointy end, with a diameter in the order of a few nanometers, a high field intensity may generated at the tip end areas, even if the amplitude of the voltage pulse applied to the electrode, is relatively small. Also, the current is not uniformly distributed. Therefore, the programming power of this non-volatile memory device is very low. The tip size (diameter) is about 50 nm, which can be controlled by variations in the nanotip growth process. The IrOx tips height is typically from 5 nm to 50 nm, although 100 nm tips heights are also possible. The IrOx nanotips density is typically greater than 100 per square-micrometer, however the density can be greater than 3,000/micrometer$^2$. Uniform device properties can be achieved for device sizes down to the deep sub-micron diameter region.

One of the methods of growing IrOx nanotips is to deposit a thin layer of Ti onto silicon substrate, to enhance the vertical alignment of the IrOx nanotips. The IrOx nanotips is grown by MOCVD, using (Methylcyclopentadieyl)(1,5-cyclooctadiene) iridium as a source reagent, at temperature of 350° C., under an oxygen pressure of 10 to 50 torr. The density and the height of the nanotips can be controlled by the sub-layer titanium thickness, the deposition pressure, temperature, and time.

After the growth of the IrOx nanotips, any conventional method may be used to fabricate the resistor memory cells. A layer of memory material, such as PCMO, or other Mott insulator material is deposited. The thickness of the memory resistor material is typically is in the range of 50 nm to 200 nm. The wafer is planarized using chemical-mechanical planarization (CMP) process prior to the deposition of the top electrode. After CMP, the thickness of the memory resistance material, from the end of the IrOx tip, to the top electrode bottom surface, is typically 30 nm to 200 nm. Hard mask and photoresist are used for selective etching the top electrode, the memory resistance material, and the bottom electrode of IrOx and Ti, out of the field region. A passivation layer, such as 10 nm to 50 nm of silicon nitride or aluminum oxide is deposited, followed by an additional silicon oxide deposition and CMP planarized as is shown in FIG. 7. The silicon nitride or aluminum oxide passivation layer is not showed in FIG. 7.

Figure 9:
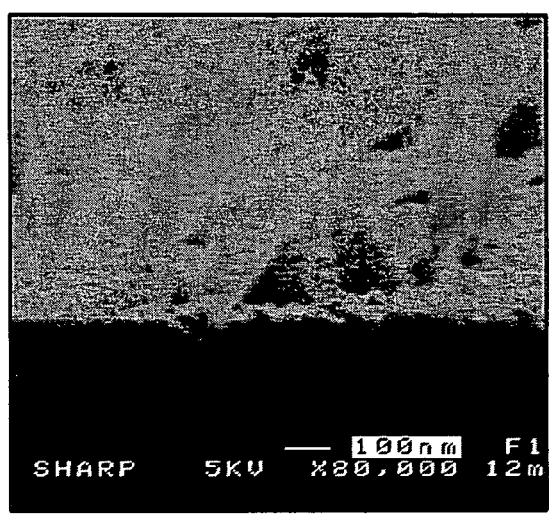
FIG. 9 is a SEM photo of an initial stage of IrOx nanotip grown.

FIG. 9 is a SEM photo of an initial stage of IrOx nanotip grown. Only a few isolated nanotips are visible.

Figure 10:
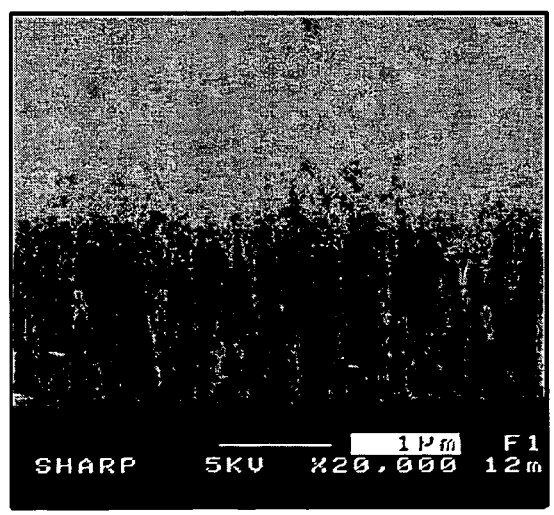
FIG. 10 is a SEM photo of fully-grown IrOx nanotips.

FIG. 10 is a SEM photo of fully-grown IrOx nanotips. A high-density vertical array of nanotips is shown.

Figure 11A:
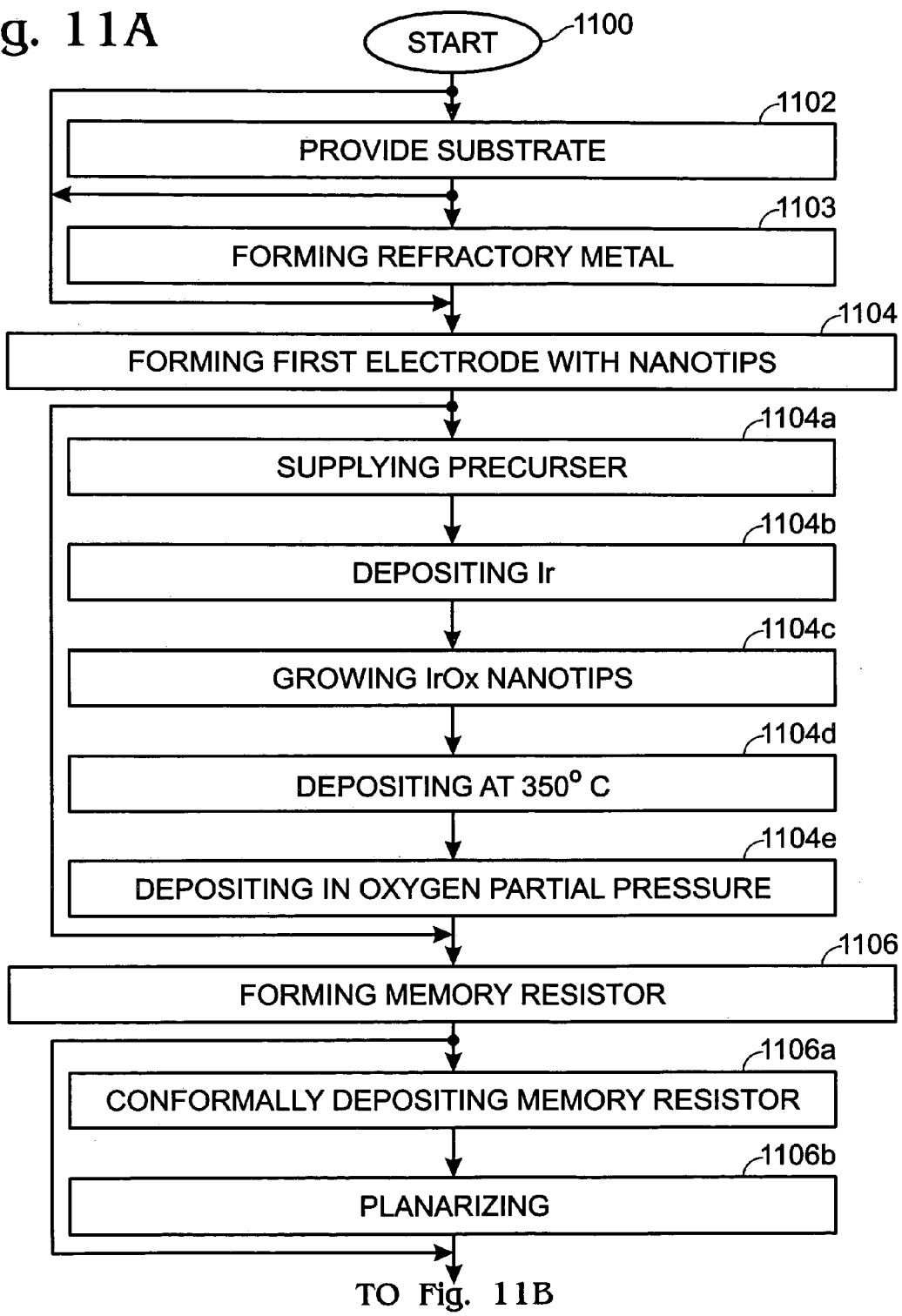
FIGS. 11A and 11B are flowcharts illustrating a method for fabricating a nanotip electrode non-volatile memory resistor cell.
Figure 11B:
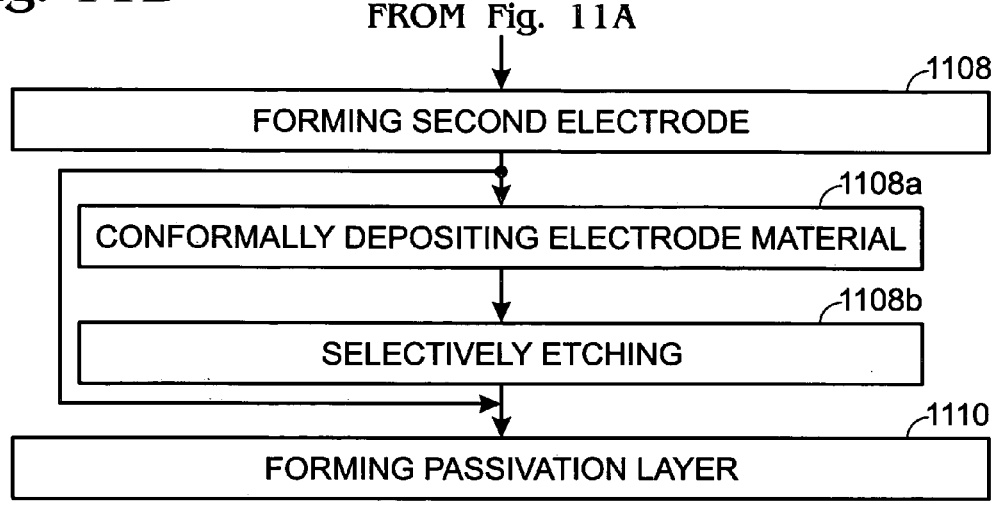

FIGS. 11A and 11B are flowcharts illustrating a method for fabricating a nanotip electrode non-volatile memory resistor cell. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. Some details of the method may be better understood in context of the explanations of FIGS. 1–10, above. The method starts at Step 1100.

Step 1104 forms a first electrode with nanotips. Step 1106 forms a memory resistor material adjacent the nanotips. More explicitly, Step 1106 forms the memory resistor material surrounding the nanotips, on the nanotips, and between the nanotips. Step 1108 forms a second electrode adjacent the memory resistor material, where the memory resistor material is interposed between the first and second electrodes.

With respect to Step 1104, the nanotips formed may have a tip base size of about 50 nanometers, or less, a tip height in the range of 5 to 50 nm, and a nanotip density of greater than 100 nanotips per square micrometer. Typically, the nanotips are iridium oxide.

In one aspect, Step 1102 provides a substrate, made from a material such as silicon, silicon oxide, silicon nitride, or a noble metal. Then, forming IrOx nanotips in Step 1104 includes substeps. Step 1104a supplies a (Methylcyclopendieyl)(1,5-cyclooctadiene) precursor. Step 1104b deposits Ir using a metalorganic chemical vapor deposition (MOCVD) process. Step 1104c grows IrOx nanotips from the deposited Ir. Step 1104d deposits the Ir at a temperature of about 350° C., and Step 1104e deposits the Ir at an oxygen partial pressure in the range of 10 to 50 torr.

In a variation of the method, Step 1103 forms a refractory metal film overlying the substrate. Then, depositing Ir using an MOCVD process in Step 1104b includes depositing Ir overlying the refractor metal film.

In one aspect, forming the memory resistor material adjacent the nanotips in Step 1106 includes forming a memory resistor material such as $Pr_{0.3}Ca_{0.7}MnO_3$ (PCMO), colossal magnetoresistive (CMR) film, transition metal oxides, Mott insulators, or high-temperature super conductor (HTSC) material. In another aspect, Step 1104 includes forming a bottom electrode with nanotips having nanotip ends, and Step 1106 includes substeps. Step 1106a conformally deposits the memory resistor material overlying the bottom electrode with nanotips. Step 1106b planarizes the memory resistor material. Then, Step 1108 forms a top electrode overlying the memory resistor material.

In one aspect, Step 1106a conformally deposits memory resistor material, having a thickness in the range of 50 to 200 nm, overlying the nanotips. Step 1106b planarizes the memory resistor material, leaving a thickness of memory resistor material, in the range of 30 to 200 nm, interposed between the nanotip ends and the top electrode.

In one aspect, forming the top electrode in Step 1108 includes substeps. Step 1108a conformally deposits top electrode material. Step 1108b selectively etches the top electrode material, memory resistor material, and the bottom electrode. Step 1110 forms a passivation layer adjacent the memory cell (see FIG. 7). The second (top) electrode can be a material such as Pt, refractory metals, refractory metal oxides, refractory metal nitrides, or Al.

Figure 12:
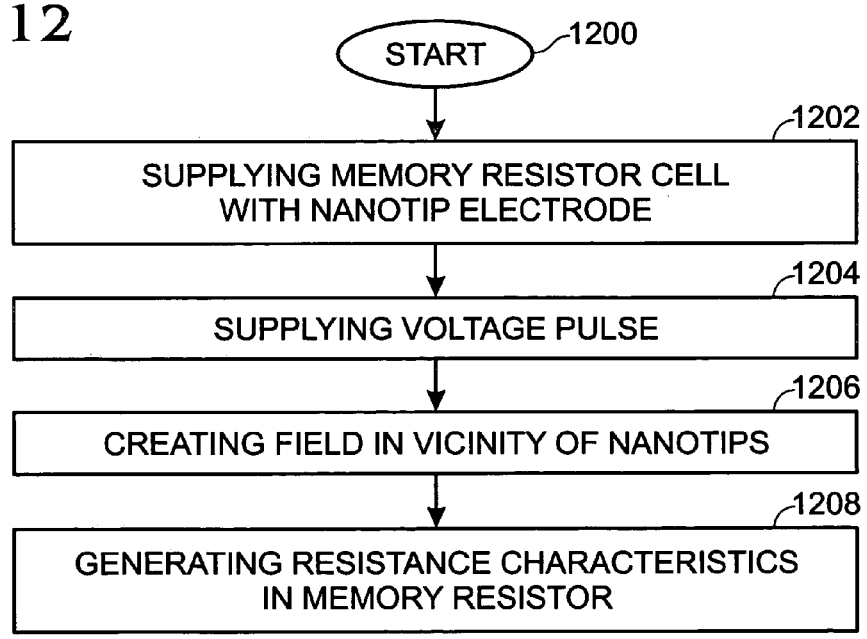
FIG. 12 is a flowchart illustrating a method for changing memory states in a memory resistor cell.

FIG. 12 is a flowchart illustrating a method for changing memory states in a memory resistor cell. The method starts at Step 1200. Step 1202 supplies a resistor memory cell with a second electrode, memory resistor material, and a first electrode having nanotips adjacent the memory resistor material. Step 1204 supplies a voltage pulse to the second electrode. Step 1206 creates a field (in the memory resistor material) in the vicinity of the nanotips. Step 1208 generates resistance characteristics of the memory resistor material in response to the field. The high resistance can be in the range of 1000 to 100,000 times greater than the low resistance.

In a bipolar switching aspect, Step 1204 supplies a narrow-width positive voltage pulse to the second (top) electrode. Then, Step 1208 generates a high resistance in the memory resistor material. In another aspect, Step 1204 supplies a narrow-width negative voltage pulse, and Step 1208 generates a low resistance. Typically, Step 1204 supplies a pulse with an absolute voltage value (positive or negative) in the range of 1.5 to 7 volts, and a narrow-width pulse width in the range of 1 to 500 nanoseconds (ns).

Alternately, in the unipolar switching aspect of the invention, Step 1204 uses a narrow-width pulse to create a high resistance as described above, but supplies a large-width positive voltage pulse to the second electrode, with a voltage value in the range of 1.5 to 7 volts, and a pulse width in the range of 1 millisecond (ms) to 10 ms. Then, Step 1208 generates a low resistance in the memory resistor material in response to the large-width positive pulse.

The above steps describe an arrangement where nanotips are grown from the first electrode and pulses are applied to the second electrode. Alternately, the pulses could be applied to the first electrode, so that the cell acts 1R1D type of cell. A negative pulse applied to the first electrode generates the same memory resistance characteristics as a positive pulse applied to the second electrode. Likewise, a positive pulse applied to the first electrode generates the same memory resistance characteristics as a negative pulse applied to the second electrode.

As noted earlier, the nanotips formed in Step 1202 are likely to be IrOx, having a tip base size of about 50 nm, or less, a tip height in the range of 5 to 50 nm, and a nanotip density of greater than 100 nanotips per square micrometer. The memory resistor material is likely to be PCMO, CMR film, transition metal oxides, Mott insulators, or HTSC material. The second electrode material is likely to be Pt, refractory metals, refractory metal oxides, refractory metal nitrides, or Al. Further, the memory resistor material typically has a thickness, between the nanotip ends and the second electrode, in the range of 30 to 200 nm.

A memory resistor cell made with a nanotip electrode, and a corresponding fabrication process has been provided. Specific materials and fabrication details have been given as examples to help illustrate the invention. However, the invention is not limited to merely these examples. Other variations and embodiments of the invention will occur to those skilled in the art.

We claim:

1. A method for fabricating a nanotip electrode nonvolatile memory resistor cell, the method comprising:
    forming a first electrode with nanotips;
    forming a memory resistor material adjacent the nanotips;
    forming a second electrode adjacent the memory resistor material, where the memory resistor material is interposed between the first and second electrodes;
    wherein forming the first electrode with nanotips includes forming a bottom electrode with nanotips having nanotip ends; and,
    wherein forming the memory resistor material adjacent the nanotips includes:
        conformally depositing the memory resistor material overlying the bottom electrode with nanotips; and
        planarizing the memory resistor material; and
    wherein forming the second electrode includes forming a top electrode overlying the memory resistor material.

2. The method of claim 1 wherein forming the first electrode with nanotips includes forming nanotips having a tip base size of about 50 nanometers, or less.

3. The method of claim 1 wherein forming the first electrode with nanotips includes forming nanotips having a tip height in the range of 5 to 50 nm.

4. The method of claim 1 wherein forming the first electrode with nanotips includes forming nanotips having a nanotip density of greater than 100 nanotips per square micrometer.

5. The method of claim 1 wherein forming the first electrode with nanotips includes forming iridium oxide (IrOx) nanotips.

6. The method of claim 5 further comprising:
    providing a substrate, made from a material selected from the group including silicon, silicon oxide, silicon nitride, and noble metals;
    wherein forming IrOx nanotips includes:
        supplying a (Methylcyclopendieyl)(1,5-cycleectahiene) precursor;
        depositing Ir using a metalorganic chemical vapor deposition (MOCVD) process; and
        growing IrOx nanotips from the deposited Ir.

7. The method of claim 6 wherein forming IrOx nanotips further includes:
    depositing the Ir at a temperature of about 350° C.; and
    depositing the Ir at an oxygen partial pressure in the range of 10 to 50 torr.

8. The method of claim 6 further comprising:
    forming a refractory metal film overlying the substrate; and
    wherein depositing Ir using an MOCVD process includes depositing Ir overlying the refractor metal film.

9. The method of claim 1 wherein forming the memory resistor material adjacent the nanotips includes forming a memory resistor material selected from the group including $Pr_{0.3}Ca_{0.7}MnO_3$ (PCMO), colossal magnetoresistive (CMR) film, transition metal oxides, Mott insulators, and high-temperature super conductor (HTSC) material.

10. The method of claim 1 wherein conformally depositing the memory resistor material includes conformally depositing memory resistor material, having a thickness in the range of 50 to 200 nm, overlying the nanotips; and
    wherein planarizing the memory resistor material includes leaving a thickness of memory resistor material, in the range of 30 to 200 nm, interposed between the nanotip ends and the top electrode.

11. The method of claim 1 wherein forming the top electrode includes:
    conformally depositing top electrode material;
    selectively etching the top electrode material, memory resistor material, and the bottom electrode; and
    the method further comprising:
    forming a passivation layer adjacent the memory cell.

12. The method of claim 1 wherein forming the second electrode includes forming a second electrode from a material selected from the group including Pt, refractory metals, refractory metal oxides, refractory metal nitrides, and Al.

13. The method of claim 1 wherein forming the memory resistor material adjacent the nanotips includes forming the memory resistor material adjacent the nanotips in a relationship selected from the group of surrounding the nanotips, on the nanotips, and between the nanotips.

* * * * *